US012154756B2

(12) United States Patent
Platzgummer et al.

(10) Patent No.: US 12,154,756 B2
(45) Date of Patent: Nov. 26, 2024

(54) BEAM PATTERN DEVICE HAVING BEAM ABSORBER STRUCTURE

(71) Applicant: IMS Nanofabrication GmbH, Brunn am Gebirge (AT)

(72) Inventors: Elmar Platzgummer, Vienna (AT); Stefan Eder-Kapl, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 0 days.

(21) Appl. No.: 17/814,464

(22) Filed: Jul. 22, 2022

(65) Prior Publication Data
US 2023/0052445 A1  Feb. 16, 2023

(30) Foreign Application Priority Data
Aug. 12, 2021 (EP) .................................... 21191090

(51) Int. Cl.
*H01J 37/09* (2006.01)
*H01J 37/147* (2006.01)

(52) U.S. Cl.
CPC .......... *H01J 37/09* (2013.01); *H01J 37/1472* (2013.01); *H01J 2237/028* (2013.01); *H01J 2237/0453* (2013.01); *H01J 2237/151* (2013.01)

(58) Field of Classification Search
CPC .. H01J 37/09; H01J 37/1472; H01J 2237/028; H01J 2237/0453;
(Continued)

(56) References Cited

U.S. PATENT DOCUMENTS 1,033,741 A    7/1912  Sims
1,420,104 A    6/1922  Howe et al.
(Continued)

FOREIGN PATENT DOCUMENTS

CN    202204836 U    4/2012
DE    19634304 A1    2/1998
(Continued)

OTHER PUBLICATIONS

Extended European Search Report for European Application No. 21175588.9, Search Completed Nov. 8, 2021, Mailed Nov. 16, 2021, 12 pgs.
(Continued)

*Primary Examiner* — David E Smith
*Assistant Examiner* — Christopher J Gassen
(74) *Attorney, Agent, or Firm* — KPPB LLP (57) ABSTRACT

A multi-beam pattern definition device for use in a particle-beam processing or inspection apparatus, which is irradiated with a beam of electrically charged particles through a plurality of apertures to form corresponding beamlets, comprises an aperture array device in which said apertures are realized according to several sets of apertures arranged in respective aperture arrangements, and an absorber array device having openings configured for the passage of at least a subset of beamlets that are formed by the apertures. The absorber array device comprises openings corresponding to one of the aperture arrangement sets, whereas it includes a charged-particle absorbing structure comprising absorbing regions surrounded by elevated regions and configured to absorb charged particles impinging thereupon at locations corresponding to apertures of the other aperture arrangements of the aperture array device, effectively confining the effects of irradiated particles and electric charge therein.

13 Claims, 6 Drawing Sheets

(58) Field of Classification Search
CPC ......... H01J 2237/151; H01J 2237/0213; H01J 2237/022; H01J 37/026; H01J 2237/0435; H01J 2237/0458; H01J 2237/1501; H01J 2237/31754; H01J 2237/31755; H01J 2237/31774; H01J 37/045; H01J 37/28; H01J 37/3177; H01J 37/3026; H01J 2237/3175

See application file for complete search history.

(56) References Cited

U.S. PATENT DOCUMENTS

| | | | |
|---|---|---|---|
| 1,903,005 | A | 3/1933 | McCuen |
| 2,187,427 | A | 1/1940 | Middleton |
| 2,503,173 | A | 4/1950 | Reisner |
| 2,820,109 | A | 1/1958 | Dewitz |
| 2,920,104 | A | 1/1960 | Brooks et al. |
| 3,949,265 | A | 4/1976 | Holl |
| 4,467,211 | A | 8/1984 | Smith |
| 4,735,881 | A | 4/1988 | Kobayashi et al. |
| 4,899,060 | A | 2/1990 | Lischke |
| 4,912,405 | A | 3/1990 | Richardson |
| 5,103,101 | A | 4/1992 | Berglund et al. |
| 5,189,306 | A | 2/1993 | Frei |
| 5,260,579 | A | 11/1993 | Yasuda et al. |
| 5,369,282 | A | 11/1994 | Arai et al. |
| 5,393,987 | A | 2/1995 | Abboud et al. |
| 5,399,872 | A | 3/1995 | Yasuda et al. |
| 5,533,170 | A | 7/1996 | Teitzel et al. |
| 5,814,423 | A | 9/1998 | Maruyama et al. |
| 5,841,145 | A | 11/1998 | Satoh et al. |
| 5,847,959 | A | 12/1998 | Veneklasen et al. |
| 5,857,815 | A | 1/1999 | Bailey et al. |
| 5,866,300 | A | 2/1999 | Satoh et al. |
| 5,876,902 | A | 3/1999 | Veneklasen |
| 5,933,211 | A | 8/1999 | Nakasugi et al. |
| 6,014,200 | A | 1/2000 | Sogard et al. |
| 6,043,496 | A | 3/2000 | Tennant |
| 6,049,085 | A | 4/2000 | Ema |
| 6,107,636 | A | 8/2000 | Muraki |
| 6,111,932 | A | 8/2000 | Dinsmore |
| 6,137,113 | A | 10/2000 | Muraki |
| 6,225,637 | B1 | 5/2001 | Terashima et al. |
| 6,229,595 | B1 | 5/2001 | McKinley |
| 6,252,339 | B1 | 6/2001 | Kendall |
| 6,258,511 | B1 | 7/2001 | Okino et al. |
| 6,280,798 | B1 | 8/2001 | Ring et al. |
| 6,333,138 | B1 | 12/2001 | Higashikawa et al. |
| 6,443,699 | B1 | 9/2002 | Mashey |
| 6,472,673 | B1 | 10/2002 | Chalupka et al. |
| 6,473,237 | B2 | 10/2002 | Mei |
| 6,552,353 | B1 | 4/2003 | Muraki et al. |
| 6,617,587 | B2 | 9/2003 | Parker |
| 6,768,123 | B2 | 7/2004 | Giering |
| 6,768,125 | B2 | 7/2004 | Platzgummer et al. |
| 6,829,054 | B2 | 12/2004 | Stanke et al. |
| 6,835,937 | B1 | 12/2004 | Muraki et al. |
| 6,858,118 | B2 | 2/2005 | Platzgummer et al. |
| 6,897,454 | B2 | 5/2005 | Sasaki et al. |
| 6,965,153 | B1 | 11/2005 | Ono et al. |
| 7,067,820 | B2 | 6/2006 | Buijsse |
| 7,084,411 | B2 | 8/2006 | Lammer-Pachlinger et al. |
| 7,124,660 | B2 | 10/2006 | Chiang |
| 7,129,024 | B2 | 10/2006 | Ki |
| 7,199,373 | B2 * | 4/2007 | Stengl ............ B82Y 40/00 250/515.1 |
| 7,201,213 | B2 | 4/2007 | Leeson |
| 7,214,951 | B2 | 5/2007 | Stengl et al. |
| 7,276,714 | B2 | 10/2007 | Platzgummer et al. |
| 7,367,738 | B2 | 5/2008 | Cleveland |
| 7,368,738 | B2 | 5/2008 | Platzgummer et al. |
| 7,446,601 | B2 | 11/2008 | LeChevalier |
| 7,459,247 | B2 | 12/2008 | Bijnen et al. |
| 7,671,687 | B2 | 3/2010 | LeChevalier |
| 7,683,551 | B2 | 3/2010 | Miyamoto et al. |
| 7,687,783 | B2 | 3/2010 | Platzgummer et al. |
| 7,710,634 | B2 | 5/2010 | Sandstrom |
| 7,714,298 | B2 | 5/2010 | Platzgummer et al. |
| 7,741,620 | B2 | 6/2010 | Doering et al. |
| 7,772,574 | B2 | 8/2010 | Stengl et al. |
| 7,777,201 | B2 | 8/2010 | Fragner et al. |
| 7,781,748 | B2 | 8/2010 | Platzgummer |
| 7,823,081 | B2 | 10/2010 | Sato et al. |
| 8,057,972 | B2 | 11/2011 | Heinrich et al. |
| 8,115,183 | B2 | 2/2012 | Platzgummer et al. |
| 8,178,856 | B2 | 5/2012 | Nakayamada et al. |
| 8,183,543 | B2 | 5/2012 | Platzgummer |
| 8,198,601 | B2 | 6/2012 | Platzgummer et al. |
| 8,222,621 | B2 | 7/2012 | Fragner et al. |
| 8,227,768 | B2 | 7/2012 | Smick et al. |
| 8,257,888 | B2 | 9/2012 | Sczyrba et al. |
| 8,258,488 | B2 | 9/2012 | Platzgummer et al. |
| 8,294,117 | B2 | 10/2012 | Kruit et al. |
| 8,304,749 | B2 | 11/2012 | Platzgummer et al. |
| 8,378,320 | B2 | 2/2013 | Platzgummer |
| 8,502,174 | B2 | 8/2013 | Wieland |
| 8,531,648 | B2 | 9/2013 | Jager et al. |
| 8,546,767 | B2 | 10/2013 | Platzgummer et al. |
| 8,563,942 | B2 | 10/2013 | Platzgummer |
| 8,598,544 | B2 | 12/2013 | Van De Peut et al. |
| 8,736,170 | B1 | 5/2014 | Liu et al. |
| 8,859,983 | B2 | 10/2014 | Wieland |
| 9,053,906 | B2 | 6/2015 | Platzgummer |
| 9,093,201 | B2 | 7/2015 | Platzgummer et al. |
| 9,099,277 | B2 | 8/2015 | Platzgummer |
| 9,165,745 | B2 | 10/2015 | Luo |
| 9,184,026 | B2 | 11/2015 | Wieland |
| 9,188,874 | B1 | 11/2015 | Johnson |
| 9,269,543 | B2 | 2/2016 | Reiter et al. |
| 9,335,638 | B2 | 5/2016 | Jager et al. |
| 9,373,482 | B2 | 6/2016 | Platzgummer |
| 9,443,699 | B2 * | 9/2016 | Platzgummer ...... H01J 37/3177 |
| 9,495,499 | B2 | 11/2016 | Platzgummer et al. |
| 9,520,268 | B2 | 12/2016 | Platzgummer |
| 9,568,907 | B2 | 2/2017 | Platzgummer et al. |
| 9,653,263 | B2 | 5/2017 | Platzgummer et al. |
| 9,691,589 | B2 | 6/2017 | Van De Peut et al. |
| 9,799,487 | B2 | 10/2017 | Platzgummer |
| 9,978,562 | B2 | 5/2018 | Van De Peut et al. |
| 10,134,565 | B2 | 11/2018 | Matsumoto |
| 10,325,756 | B2 | 6/2019 | Platzgummer |
| 10,325,757 | B2 | 6/2019 | Platzgummer et al. |
| 10,410,831 | B2 | 9/2019 | Platzgummer |
| 10,483,080 | B1 | 11/2019 | Cook et al. |
| 10,522,329 | B2 | 12/2019 | Platzgummer et al. |
| 10,651,010 | B2 | 5/2020 | Platzgummer et al. |
| 10,840,054 | B2 | 11/2020 | Platzgummer et al. |
| 11,099,482 | B2 | 8/2021 | Hochleitner et al. |
| 11,569,064 | B2 | 1/2023 | Platzgummer et al. |
| 11,735,391 | B2 | 8/2023 | Gerhold et al. |
| 2001/0028038 | A1 | 10/2001 | Hamaguchi et al. |
| 2002/0000524 | A1 | 1/2002 | Suzuki et al. |
| 2002/0021426 | A1 | 2/2002 | Mei et al. |
| 2002/0036264 | A1 | 3/2002 | Nakasuji et al. |
| 2002/0148978 | A1 | 10/2002 | Innes et al. |
| 2003/0085360 | A1 | 5/2003 | Parker et al. |
| 2003/0106230 | A1 | 6/2003 | Hennessey |
| 2003/0139054 | A1 | 7/2003 | Fujimoto |
| 2003/0155534 | A1 | 8/2003 | Platzgummer et al. |
| 2003/0160980 | A1 | 8/2003 | Olsson et al. |
| 2004/0056207 | A1 | 3/2004 | Petrov et al. |
| 2004/0058536 | A1 | 3/2004 | Ki |
| 2004/0119021 | A1 | 6/2004 | Parker et al. |
| 2004/0119023 | A1 | 6/2004 | Nakasuji et al. |
| 2004/0135102 | A1 * | 7/2004 | Muraki ............ B82Y 10/00 250/397 |
| 2004/0157407 | A1 | 8/2004 | Qin-Yi et al. |
| 2004/0169147 | A1 | 9/2004 | Ono et al. |
| 2005/0001178 | A1 | 1/2005 | Parker et al. |
| 2005/0063510 | A1 | 3/2005 | Hieronimi et al. |
| 2005/0072941 | A1 | 4/2005 | Tanimoto et al. |
| 2005/0104013 | A1 * | 5/2005 | Stengl ............ B82Y 10/00 250/492.1 |
| 2005/0242302 | A1 | 11/2005 | Platzgummer et al. |

(56) References Cited

U.S. PATENT DOCUMENTS

| | | |
|---|---|---|
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0212052 A1 | 9/2008 | Wagner et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0266413 A1 | 10/2008 | Cohen et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0057571 A1 | 3/2009 | Goto |
| 2009/0101816 A1 | 4/2009 | Noji et al. |
| 2009/0168043 A1 | 7/2009 | Lee |
| 2009/0200495 A1 | 8/2009 | Platzgummer et al. |
| 2009/0249266 A1 | 10/2009 | Pierrat et al. |
| 2009/0256075 A1 | 10/2009 | Kemen et al. |
| 2009/0321631 A1 | 12/2009 | Smick et al. |
| 2010/0124722 A1 | 5/2010 | Fragner et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |
| 2010/0224790 A1 | 9/2010 | Platzgummer et al. |
| 2010/0288938 A1 | 11/2010 | Platzgummer |
| 2011/0049393 A1 | 3/2011 | De Boer et al. |
| 2011/0053087 A1 | 3/2011 | Nielsen et al. |
| 2011/0073782 A1 | 3/2011 | Wieland |
| 2011/0084219 A1 | 4/2011 | Adamec et al. |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0001097 A1 | 1/2012 | Yashima et al. |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0091318 A1* | 4/2012 | Wieland ............ H01J 37/3177 250/208.2 |
| 2012/0151428 A1 | 6/2012 | Tanaka et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0286173 A1 | 11/2012 | Van De Peut et al. |
| 2012/0288787 A1 | 11/2012 | Choi et al. |
| 2012/0329289 A1 | 12/2012 | Fujimura et al. |
| 2013/0070222 A1 | 3/2013 | Fujimura |
| 2013/0120724 A1 | 5/2013 | Wieland et al. |
| 2013/0128247 A1 | 5/2013 | Khuat et al. |
| 2013/0157198 A1 | 6/2013 | Yoshikawa et al. |
| 2013/0161511 A1 | 6/2013 | Karimata et al. |
| 2013/0164684 A1 | 6/2013 | Yamanaka |
| 2013/0198697 A1 | 8/2013 | Hotzel et al. |
| 2013/0201468 A1 | 8/2013 | Manakli |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0061499 A1 | 3/2014 | Ogasawara et al. |
| 2014/0158916 A1 | 6/2014 | Fujimura |
| 2014/0168629 A1 | 6/2014 | Nishida et al. |
| 2014/0197327 A1 | 7/2014 | Platzgummer |
| 2014/0240732 A1 | 8/2014 | Tinnemans et al. |
| 2014/0264066 A1 | 9/2014 | Van De Peut et al. |
| 2014/0264085 A1 | 9/2014 | Van De Peut et al. |
| 2014/0264086 A1 | 9/2014 | Van De Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1* | 10/2015 | Platzgummer ........ H01J 37/147 250/396 R |
| 2015/0347660 A1 | 12/2015 | Platzgummer et al. |
| 2016/0012170 A1 | 1/2016 | Platzgummer |
| 2016/0013019 A1 | 1/2016 | Platzgummer |
| 2016/0064180 A1 | 3/2016 | Ren et al. |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0284509 A1 | 9/2016 | Matsumoto |
| 2016/0284513 A1 | 9/2016 | Inoue |
| 2016/0336147 A1 | 11/2016 | Platzgummer |
| 2016/0349626 A1 | 12/2016 | Matsumoto |
| 2017/0032926 A1 | 2/2017 | Miyamoto |
| 2017/0154750 A1 | 6/2017 | Sato |
| 2017/0357153 A1 | 12/2017 | Platzgummer |
| 2018/0019094 A1 | 1/2018 | Iwata |
| 2018/0108516 A1 | 4/2018 | Umezawa et al. |
| 2018/0218879 A1 | 8/2018 | Platzgummer et al. |
| 2019/0066976 A1 | 2/2019 | Platzgummer et al. |
| 2019/0088448 A1 | 3/2019 | Platzgummer et al. |
| 2019/0214226 A1 | 7/2019 | Platzgummer et al. |
| 2019/0237288 A1 | 8/2019 | Platzgummer et al. |
| 2019/0304749 A1 | 10/2019 | Yoshikawa et al. |
| 2020/0051261 A1 | 2/2020 | Tsuruyama et al. |
| 2020/0312619 A1* | 10/2020 | Mangnus ............. H01J 37/28 |
| 2020/0348597 A1 | 11/2020 | Hochleitner et al. |
| 2021/0240074 A1 | 8/2021 | Spengler et al. |
| 2021/0335573 A1 | 10/2021 | Gerhold et al. |
| 2022/0384143 A1 | 12/2022 | Platzgummer et al. |
| 2023/0015805 A1 | 1/2023 | Spengler et al. |

FOREIGN PATENT DOCUMENTS

| | | |
|---|---|---|
| EP | 0178156 A2 | 4/1986 |
| EP | 0928012 A2 | 7/1999 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2190003 A2 | 5/2010 |
| EP | 2214194 A1 | 8/2010 |
| EP | 2312609 A1 | 4/2011 |
| EP | 2317535 A2 | 5/2011 |
| EP | 2363875 A1 | 9/2011 |
| EP | 2950325 A1 | 12/2015 |
| EP | 2993684 A1 | 3/2016 |
| EP | 3037878 A1 | 6/2016 |
| EP | 3070528 A1 | 9/2016 |
| EP | 3460824 A1 | 3/2019 |
| EP | 3460825 A1 | 3/2019 |
| EP | 3518268 A1 | 7/2019 |
| GB | 736995 A | 9/1955 |
| GB | 2349737 A | 11/2000 |
| JP | 4891970 A | 11/1973 |
| JP | 1315934 A | 12/1989 |
| JP | 3155029 A | 7/1991 |
| JP | 3297041 A | 12/1991 |
| JP | 08213301 A | 8/1996 |
| JP | 2004349168 A | 12/2004 |
| JP | 2006019436 A | 1/2006 |
| JP | 2006332289 | 12/2006 |
| JP | 2007172862 A | 7/2007 |
| JP | 2010098275 A | 4/2010 |
| JP | 2014175104 A | 9/2014 |
| JP | 2015029096 A | 2/2015 |
| JP | 2015162513 A | 9/2015 |
| JP | 2016178300 A | 10/2016 |
| JP | 2017519356 A | 7/2017 |
| WO | 200024030 A2 | 4/2000 |

(56) References Cited

FOREIGN PATENT DOCUMENTS

| WO | 200109922 A1 | 2/2001 |
|---|---|---|
| WO | 2006084298 A1 | 8/2006 |
| WO | 2008017982 A2 | 2/2008 |
| WO | 2008053140 A1 | 5/2008 |
| WO | 2009147202 | 12/2009 |
| WO | 2012041464 A1 | 4/2012 |
| WO | 2012172913 A1 | 12/2012 |

OTHER PUBLICATIONS

Extended European Search Report for European Application No. 21191090.6, Search completed May 12, 2022, Mailed May 19, 2022, 9 pgs.
European Search Report for Application 08450077.6, report dated Jan. 29, 2010, 2 pgs.
European Search Report for Application 09450211.9-1226; report dated Sep. 14, 2010; 4 pgs.
European Search Report for application 09450212.7; dated Sep. 28, 2010, 9 pgs.
European Search Report for Application 141501197.7, report dated Jun. 6, 2014, 2 pgs.
European Search Report for Application No. 14165967, report dated Oct. 30, 2014, 2 pgs.
European Search Report for Application No. 14165970, report dated Jun. 18, 2014, 2 pgs.
European Search Report for Application No. 14170611, report dated Nov. 4, 2014, 3 pgs.
European Search Report for Application No. 14176563, report dated Jan. 14, 2015, 2 pgs.
European Search Report for Application No. 14177851; report dated Oct. 16, 2014; 1 page.
European Search Report for Application No. 14199183, report dated Jun. 19, 2015, 2 pgs.
European Search Report for Application 15159397.7, report dated Sep. 28, 2015, 7 pgs.
European Search Report for Application 15159617.8, report dated Oct. 19, 2015, 3 pgs.
European Search Report for Application No. 15164770, report dated Sep. 18, 2015; 2 pgs.
European Search Report for Application No. 15164772, report dated Sep. 11, 2015, 2 pgs.
European Search Report for Application No. 15169632, report dated Oct. 20, 2015, 3 pgs.
European Search Report for Application No. 15171348, report dated Oct. 30, 2015, 2 pgs.
European Search Report for EP 14176645, completed Dec. 1, 2014, 1 pg.
European Search Report for EP Application No. 16174185, Search Completed Dec. 6, 2016, 2 pgs.
European Search Report for EP Application No. 20155217, Search completed Jul. 20, 2020, 1 pg.
European Search Report for European Application 10450070.7 dated May 7, 2012, 13 pgs.
European Search Report for European Application No. 16160622, Search completed Jul. 21, 2016, Mailed Jul. 21, 2016, 3 Pgs.
European Search Report for European Application No. 19172550.6, Search completed Dec. 11, 2019, 1 Pg.
European Search Report for European Application No. 16160621, Report Completed Oct. 5, 2016, 3 pgs.
Extended European Search Report for European Application No. 16169216.5, Search completed Sep. 21, 2016, Mailed Sep. 29, 2016, 12 Pgs.
Extended European Search Report for European Application No. 17153506, Search completed Oct. 5, 2017, Mailed Oct. 16, 2017, 2 Pgs.
Extended European Search Report for European Application No. 17187922.4, Search completed Feb. 21, 2018, Mailed Mar. 6, 2018, 7 Pgs.
Extended European Search Report for European Application No. 17191553.1, Search completed Mar. 22, 2018, Mailed Apr. 9, 2018, 5 Pgs.
Extended European Search Report for European Application No. 18150797.1, Search completed Jun. 29, 2018, Mailed Jul. 9, 2018, 8 Pgs.
Extended European Search Report for European Application No. 18154140.0, Search completed Aug. 16, 2018, Mailed Sep. 4, 2018, 5 Pgs.
Extended European Search Report for European Application No. 21185599.4, Search completed Jan. 4, 2022, Mailed Jan. 17, 2022, 6 Pgs.
Extended Search Report for European Application No. 20171308.8, Search completed Oct. 30, 2020, Mailed Nov. 12, 2020, 17 Pgs.
"Dither", Wikipedia, Retrieved from https://en.wikipedia.org/w/index.php?title=Dither&oldid=762118152 on Oct. 5, 2017.
"Ordered dithering", Wikipedia, Retrieved from https://en.wikipedia.org/w/index.php?title=Ordered_dithering&oldid=759840417 on Oct. 5, 2017.
Berry et al., "Programmable aperture plate for maskless high-throughput nanolithography", J. Vac. Sci. Technol., Nov./Dec. 1997, vol. B15, No. 6, pp. 2382-2386.
Borodovsky, "EUV, EBDW—ARF Replacement or Extension?", KLA-Tencor Lithography User Forum, Feb. 21, 2010, San Jose, CA, USA, 21 pgs.
Borodovsky, "MPProcessing for MPProcessors", SEMATECH Maskless Lithography and Multibeam Mask Writer Workshop, May 10, 2010, New York, NY, USA, 35 pgs.
Disclosed Anonymously, "Multi-tone rasterization, dual pass scan, data path and cell based vector format", IPCOM000183472D, printed from ip.com PriorArtDatabase, published May 22, 2009, 108 pages.
Hinterberger, "Ion optics with electrostatic lenses", University of Bonn, Germany, 2006, 18 pgs.
Huber et al., "Computing Straight Skeletons and Motorcycle Graphs: Theory and Practice", Thesis, Univ. of Salzburg (Austria) Jun. 2011, 134 pgs.
Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8, doi: 10.1088/0960-1317/21/4045038.
Kim et al., "Binary-encounter-dipole model for electron-impact ionization", Physical Review A, Nov. 1994, vol. 50, No. 3, pp. 3954-3967.
Li et al., "Through-Silicon Interposer Technology for Heterogeneous Integration", Future Fab Intl., Issue 45 (Apr. 25, 2013), 6 pgs.
Munro, "Finite difference programs for computing tolerances for electrostatic lenses", Journal of Vacuum Science & Technology B, Jun. 4, 1988, vol. 6, pp. 941-948, doi: 10.1116/1.584329.
Palfrader et al., "Computing Mitered Offset Curves Based on Straight Skeletons", Computer-Aided Design & Applications, vol. 12, No. 4, Feb. 11, 2015, pp. 414-424, http://dx.doi.org/10.1080/16864360.2014.997637.
Paraskevopoulos et al., "Scalable (24-140 Gbps) optical data link, well adapted for future maskless lithography applications", Proc. SPIE vol. 7271, 72711 I (2009), 11 pgs., doi: 10.1117/12.811495.
Platzgummer et al., "eMET—50keV electron Mask Exposure Tool Development based on proven multi-beam projection technology", Proc. of SPIE, 2010, vol. 7823, pp. 782308-1-782308-12, doi: 10.1117/12.811495.
Platzgummer et al., "eMET POC: Realization of a proof-of-concept 50 keV electron multibeam Mask Exposure Tool", Proc. of SPIE, 2011, vol. 8166, pp. 816622-1-816622-7, doi: 10.1117/12.895523.
Shih, "Image processing and mathematical morphology: fundamentals and applications", CRC Press, 2009, pp. 26-32.
Vink et al., "Materials with a high secondary-electron yield for use in plasma displays", Applied Physics Letters, Mar. 25, 2002, vol. 80, No. 12, pp. 2216-2218, DOI: 10.1063/1.464229.
Wheeler et al., "Use of Electron Beams in VLSI", G.E.C.Journal of Science and Technology, General Electric Company. Wembley, Middlesex, GB, vol. 48, No. 2, Jan. 1, 1982 (Jan. 1, 1982), pp. 103-107, XP000820522.

(56) References Cited

OTHER PUBLICATIONS

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860, DOI: 10.1116/1.2366677.

\* cited by examiner

BEAM PATTERN DEVICE HAVING BEAM ABSORBER STRUCTURE

CROSS REFERENCE TO RELATED APPLICATIONS

This application claims priority to European Application No. 21191090.6, filed Aug. 12, 2021, the disclosure of which is incorporated by reference herein in its entirety.

FIELD OF THE INVENTION

The invention relates to a multi-beam pattern definition device (hereinafter referred to as "PD device") for use in a particle-beam processing or inspection apparatus, which device is adapted to be irradiated with a beam of electrically charged particles, in particular electrons, and allow passage of the beam through a plurality of apertures, thus forming a corresponding number of beamlets, said device comprising several components including an aperture array device in which the mentioned apertures are defined for forming a corresponding number of beamlets.

BACKGROUND OF THE INVENTION

PD devices of the mentioned type and charged-particle multi-beam processing apparatuses incorporating such PD devices are disclosed in U.S. Pat. Nos. 6,768,125, 8,546,767, and 9,269,543 of the applicant, the teachings of which are hereby incorporated into the present disclosure.

The mentioned documents describe a charged-particle lithography and processing method and apparatus dubbed PML2 (short for "Projection Mask-Less Lithography"); several publications by the applicant describe a processing apparatus called eMET (short for "electron multi-beam Mask Exposure Tool"). These apparatuses realize a multi-beam writing concept and use a programmable aperture plate system (APS) as a PD device for structuring a particle beam, which is extracted from a single source of electrically charged particles.

The PD device comprises an aperture array device, an opening array device and a deflection array device which, in accordance with U.S. Pat. No. 8,546,767, may be provided with "multiple multi-beam arrays" that contain multiple arrays of apertures, by virtue of the aperture array device (AAD) comprising at least two sets of apertures, which each comprise a plurality of apertures arranged in a (substantially) regular arrangement on the AAD, with the arrangement of these two or more sets being interlacing at least partially, wherein the apertures of different sets are—at least in a region where the arrangements are interlacing—offset to each other by displacements which (substantially) correspond to a common displacement vector. In correspondence with this and as a means to select one of the sets of apertures, the opening array device comprises a plurality of openings which are configured for the passage of at least a subset of beamlets that are formed by the apertures of the AAD, wherein, in at least a region corresponding to said region of interlacing of arrangements, the opening array device comprises plurality of openings arranged in a substantially regular arrangement corresponding to the arrangement of one of the sets of apertures in said region, while it lacks openings (so the opening array device is opaque there) at locations corresponding to apertures of the other set(s) of apertures.

Furthermore, a deflection array device, for instance in the form of a so-called blanking plate, may often be present as an additional separate component of the PD device: The deflection array device has a plurality of blanking openings located such that each of the beamlets, formed in the AAD and transmitted by the opening array, traverses one of the blanking openings along a nominal path, wherein the deflection array device comprises a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

Furthermore, advantageously, positioning devices may be provided which can position the AAD, in order to adjust the position of the aperture array device relative to the opening array device and deflection array device. These positioning devices are configured to selectively bring one of the sets of apertures in the AAD, namely a selected set, into alignment with the plurality of openings in the opening array device and blanking array device, such that the apertures and openings and blanking openings are in alignment in at least the region of interlacing of arrangements.

While the above construction proved to be of great use, the inventors noted that in certain situations problems during use of the PD device could arise. At the opening array device, subsets of the beamlets are blocked by the bulk (lacking openings) of the opening array. The interaction of beamlets (of charged particles as mentioned) with the bulk of the opening array device may often cause generation of secondary particles, for example electrons. While part of the secondary particles will remain within the material, a certain fraction may be emitted from the material, in angular directions covering a polar angular range of 0 to 90 degrees and an azimuthal angle range of 0 to 360 degrees. Here, the polar angle is the angle between the emission direction and the surface normal of the opening array device, pointing essentially from said opening array device towards the nearest part of the AAD. For secondary particles, the angular distribution will typically follow a cosine law (with respect to the polar angle) with a maximum at a polar angle of 0 degrees. Such emission of secondary particles will occur typically within several μm (for electron beamlets with 5 keV energy) around the site where the beamlet impinges on the surface of the opening array device.

Where electrically charged secondary particles (especially electrons) occur, they will, predominantly in direct line of sight, potentially deposit and accumulate charge at other sites of the AAD and opening array device. Accumulation of electric charge is promoted by locally pronounced low electric conductivity at those sites, which hinders the charge to flow or dissipate towards electric ground. The accumulated electric charge will generate an electric field which may deflect the (primary) beamlets, which may and cause unwanted beamlet displacement at the target surface, resulting in a degradation of pattern fidelity. This may also involve a locally pronounced low electric conductivity caused by surface contamination of the aperture array device or the opening array device. Such contaminations may be caused, for instance, by particles or fabrication process remainders or by decomposition of residual gas molecules (predominantly those containing carbon) by primary beamlet particles and subsequent deposition (of carbon containing solid material).

SUMMARY OF THE INVENTION

In view of the above it is an aim of the invention to improve the layout of the PD device to overcome the possible problems mentioned above, and in particular improve the elimination of charged particles and related electric charge of beamlets that are blocked within the PD device.

This aim is met by a multi-beam pattern definition device of the type as described in the beginning, which comprises an aperture array device and, preferably located downstream of the aperture array device and preferably at a distance to the latter, an absorber array device which includes a charged-particle absorbing structure configured to absorb charged particles of some of the beamlets formed by the aperture array device and impinging on the absorber array device.

More specifically, the aperture array device, also referred to as "aperture plate", comprises at least two sets of apertures transparent to the beam (so the beam traverses the aperture array device through the apertures); each set of apertures comprises a plurality of apertures, which are arranged in a substantially regular arrangement on the aperture array device with the arrangements of said sets ("aperture arrangements") being interlacing at least partially, wherein the apertures of different sets are, at least in a region where the arrangements are interlacing, offset to each other by respective displacement vectors. The absorber array device has a plurality of openings configured for the passage of at least a subset of beamlets that are formed by said apertures, but, as already mentioned, also includes a charged-particle absorbing structure that comprises absorbing regions surrounded by absorber flanks, which are elevated with respect to the absorbing regions, so as to absorb charged particles impinging upon these absorbing structures, in particular the absorbing regions; these absorbing regions are located at locations corresponding to apertures of at least one of said set of apertures in at least a region corresponding to said region of interlacing; in contrast, the plurality of openings in the absorber array device are arranged in a substantially regular arrangement which corresponds to the aperture arrangement of at least one other of said sets of apertures in said region. In typical embodiments, the opening correspond to one of the sets of apertures, and the absorbing structure is configured to eliminate/absorb the particles which traverse the aperture array device through the apertures of all other sets of apertures.

Thus, the apertures are positioned according to multiple sets which realize mutually geometrically equivalent "aperture arrangements"—at least in the region of interlacing aperture arrangements. The region of interlacing will usually extend over a considerable part of the area of each of the aperture arrangements, i.e., the majority of the area, usually the vast majority, for instance leaving out only a few rows of apertures at some or all edges of the aperture arrangement area. Each of the aperture arrangements is associated with a different displacement vector (with respect to some arbitrary point of reference, such as a central aperture of the first aperture arrangement); evidently, the displacement vector, which describes the offset of one aperture arrangement with respect to another one of the aperture arrangements, is substantially uniform for all apertures of the same aperture arrangement at least in said region of interlacing of aperture arrangements.

The apertures in an aperture arrangements are, as mentioned, arranged according to a substantial regular arrangement, where a regular arrangement means that the nominal locations of the apertures are according to a regular grid on the surface plane of the aperture array device; for instance, the grid may be a square grid, rectangular grid, hexagon grid, etc. Each arrangement is substantially regular in that the positions of the individual apertures may deviate from the (nominal) positions in a strictly regular grid by small deviations (herein, "small" means smaller by at least one order of magnitude than the mutual distance of apertures within the same arrangement) and/or an arrangement may contain a small number of apertures which do not conform to the regular grid (wherein the small number is smaller by at least one order of magnitude than the total number of aperture in the arrangement). The mentioned small deviations may be provided, for instance, for allowing correction of imaging aberrations which will vary across the area of the aperture array device, predictable distortions in the device, or the like. The displacement vector between arrangements is substantially uniform in that the offset between respectively corresponding apertures of two arrangements is the same when the mentioned small deviations are discounted—with the exception of the small number of apertures not conforming to the regular grid, which are not to be considered in this regard. Any two arrangements which differ only by such a substantially uniform displacement vector, at least within the region of interlacing, are herein referred to as "equivalent arrangements".

In addition, a positioning arrangement for positioning the aperture array device and/or the absorber array device is advantageously provided, for adjusting the relative position of the aperture array device with respect to the absorber array device, said positioning arrangement being configured to selectively bring a selected set of the sets of apertures in the aperture array device into alignment with the plurality of openings in the absorber array device in at least said region of interlacing of arrangements.

In many embodiments of the invention, the multi-beam pattern definition device may also comprise a deflection array device, also referred to as blanking plate, having a plurality of blanking openings located such that each of the beamlets traverses one of the blanking openings along a nominal path, the deflection array device comprising a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode. This component is advantageous for use in certain writing methods which employ this kind of blanking. The deflection array device is preferably located downstream of the absorber array device.

In many typical embodiments of the invention, it will be advantageous that the charged-particle absorbing structure comprises a plurality of charged-particle absorbing devices, each of which is located at a position on the absorber array device corresponding to the place where one of the beamlets impinges (i.e., corresponding to one aperture of the aperture array device) and is configured to absorb charged particles of said beamlet.

Furthermore, the charged-particle absorbing devices may be realized as recesses or blind holes formed in the surface of the absorber array device, typically the surface oriented towards the aperture array device. Preferably these recesses may extend along the respective directions of beamlets impinging thereupon. The recesses or blind holes may, suitably, have a depth to width ratio of 2 or larger, e.g. 3 or larger, or even 4 or larger.

In one advantageous group of embodiments of the invention, the charged-particle absorbing devices may be realized as protruding structures (also referred to as screening electrodes) formed on the surface of the absorber array device (specifically, the surface facing the aperture array device).

These electrode-like structures protruding from the surface may, suitably, have a depth to width ratio of 2 or larger, e.g. 3 or larger, or even 4 or larger.

In another advantageous group of embodiments (or possibly in combination with the previous group), the charged-particle absorbing structure may comprise trenches and/or openings having a width which is larger than the lateral size of the apertures of the aperture array device by a factor of two (again, this factor may be 2 or larger, e.g. 3 or larger, or even 4 or larger).

In addition, the absorber array device may advantageously comprise an electrically conductive coating formed on at least the side thereof facing towards the aperture array device (i.e., at least on the absorber flanks).

Furthermore, the aperture array device and/or the absorber array device may be configured movable within a plane transversal to a direction of propagation of the particle beam, so as to allow for adjusting the relative position of the aperture array device with respect to the absorber array device. Thus, it is possible to select any one of the sets of apertures in the aperture array device. In order to achieve a suitable way of such position adjustment, a positioning device or positioning arrangement may be provided, for positioning at least one of the aperture array device and the absorber array device for adjusting the relative position of the aperture array device with respect to the absorber array device, said positioning device being configured to selectively bring a selected set of the sets of apertures in the aperture array device into alignment with the plurality of openings in the absorber array device in at least said region of interlacing of arrangements. Advantageously, the distance between the aperture array device and absorber array device is chosen suitably so as to allow free relative movement between them; a typical value of the distance in the order of 0.5 mm to a few mm, preferably 1-2 mm.

BRIEF DESCRIPTION OF THE DRAWINGS

In the following, in order to further demonstrate the present invention, illustrative and non-restrictive embodiments are discussed, as shown in the drawings, which schematically show.

DETAILED DESCRIPTION OF EMBODIMENTS OF THE INVENTION

In the following, first the technical background of the invention is discussed—as far as relevant to typical embodiments of the invention—, then several exemplary embodiments of the invention are presented in detail.

The detailed discussion of exemplary embodiments of the invention given below discloses the basic concepts and further advantageous developments of the invention. It will be evident to the person skilled in the art to freely combine several or all of the embodiments discussed here as deemed suitable for a specific application of the invention. Throughout this disclosure, terms like "advantageous", "exemplary", "typical", or "preferred" indicate elements or dimensions which are particularly suitable (but not essential) to the invention or an embodiment thereof, and may be modified wherever deemed suitable by the skilled person, except where expressly required. It will be appreciated that the invention is not restricted to the following embodiments or the particular layout of the PD system, which merely represent one of the possible applications of the invention, and are given for illustrative purpose and merely present suitable implementations of the invention; also, embodiments of the invention are suitable for other types of processing systems that use a multi-beam setup for exposure of a target. Within this disclosure, terms relating to a vertical direction or vertical propagation, such as "upper" or "upstream"/"downstream", are to be understood with regard to the direction of the beam, which is thought to run downwards along a longitudinal direction ("vertical axis"). This vertical axis, in turn, is identified with the Z direction, to which the X and Y directions are transversal.

Charged-Particle Multi-Beam System

Figure 1:
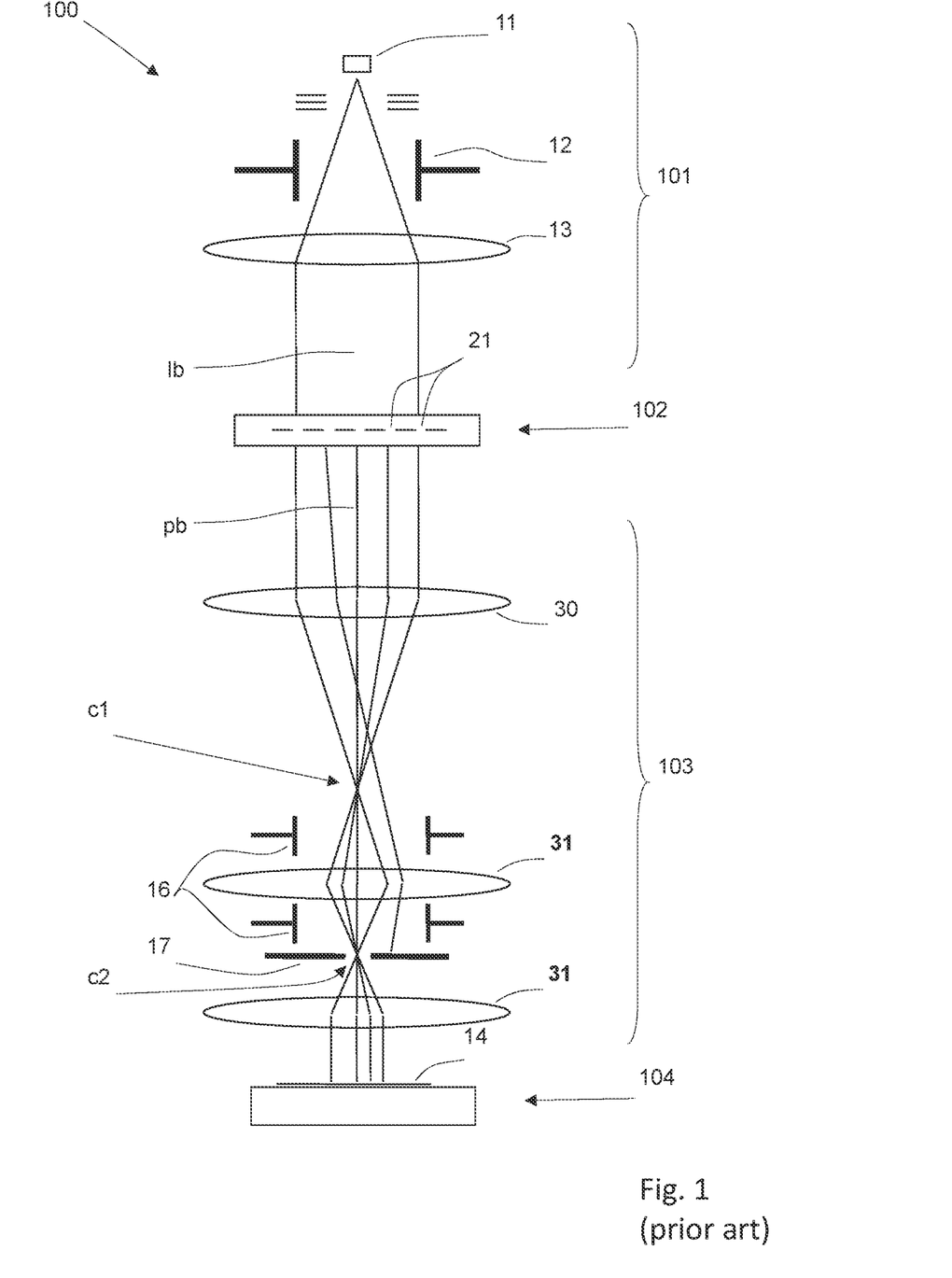
FIG. 1 a particle-beam exposure apparatus suitable for the invention in a longitudinal sectional overview.

A schematic overview of a charged-particle multi-beam mask exposure tool (mask writer) 100 of the type of an eMET system, employing embodiments of the invention, is shown in FIG. 1. In the following, only those details are given as needed to disclose the certain embodiments of the invention such that one of ordinary skill in the art can practice the respective embodiments; invention; for the sake of clarity, the components are not shown to size in FIG. 1, particularly the lateral width of the particle beam is exaggerated; for more details, the reader is referred to U.S. Pat. Nos. 6,768,125, 8,546,767, and 7,781,748, whose teachings with respect to the overall layout of the particle-beam apparatus and the PD device are herewith included by reference.

A source suitable for generating an electron beam is used in the system 100. In a variant, the beam could be realized with other electrically charged particles, in particular ions of positive charge, using a suitable ion source. A particle-optical illumination system forms the beam into a wide beam which illuminates a PD device having a regular array of apertures in order to define a beam pattern to be projected on a target surface. With each aperture, a small beam, hereinafter usually referred to as 'beamlet' is defined, and the passage of each beamlet through an aperture can be controlled so as to allow ('switch on') or effectively deactivate ('switch off') the passage of particles of the beam through the apertures and/or subsequent demagnifying charged-particle projection optics towards the target.

The beamlets traversing the aperture array form a patterned particle beam as represented by the spatial arrangement of the apertures and including information of on-off definitions for the individual beamlets. The patterned beam is then projected by means of a demagnifying charged-particle optical projection system onto the target (for instance, a mask blank or a semiconductor wafer substrate) where an image of those apertures whose corresponding beams are not deflected is thus formed to expose or to modify the target at the irradiated portions. The images formed by the beamlets projected to the substrate form a "pattern image", which is exposed along a straight path ("stripe") on the substrate mechanically moving in one direction; the (large-scale) motion of the substrate is usually achieved by a continuous motion of the target stage, possibly with fine adjustment of the projection system at the same time.

The direction of movement of the image relative to the stage is also dubbed (main) scanning direction. An additional scanning of the beam in a direction perpendicular to the main scanning direction is done only within a small lateral range, for instance to compensate for lateral travel motion errors of the scanning stage and/or to include a (limited) number of parallel pixel rows, as explained more in detail in U.S. Pat. No. 9,053,906 of the applicant, which document is herewith included by reference.

The main components of the apparatus 100 are—in the order of the direction of the beam lb, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101, 102, 103 and the target station 104 of the apparatus 100 are contained in a vacuum housing (not shown) held at high vacuum to ensure an unimpeded propagation of the beam lb, pb along the optical axis of the apparatus.

The illumination system 101 comprises, for instance, an electron or ion source 11, an extractor arrangement defining the location of the virtual source, a general blanker 12, which in the case of using ion beams may also be used as particle filter, and an illumination charged-particle optics realized by a particle optical condenser lens system 13.

In the embodiment shown the particle source 11 emits energetic electrons of a suitable kinetic energy such as, e.g., 5 keV; in other implementations, other electrically charged particles such as ions of primarily a certain species may be used, such as hydrogen or Ar+ ions having a defined (kinetic) energy of typically several keV (e.g. 5 keV at the PD system 102) with a comparatively small energy spread of, e.g., $\Delta E=1$ eV. A velocity/energy dependent filter (not shown) may be provided to filter out other, unwanted particle species that may also be produced in the source 11; the filter may also be used to blank out the beam as a whole during repositioning of the beamlets. By means of the condenser lens system 13, the charged particles emitted from the source 11 are formed into a wide-area, substantially telecentric beam ("illuminating beam") lb.

The beam lb then irradiates a blanking device which, together with the devices needed to keep its position (not shown), forms the PD device 102, which is described in more detail below with reference to FIGS. 2-4. The PD device is held at a specific position in the path of the beam lb, which thus irradiates an aperture array pattern formed by a plurality of apertures 21. As already mentioned, each of the apertures can be "switched on" or "off". In a "switched on" or "open" state, an aperture allows the beamlet passing through the respective aperture to reach the target; it is then said, the aperture is transparent to the incident beam. Otherwise, the aperture is "switched off" or "closed", in which case the beam path of the respective beamlet is affected (e.g. by means of deflecting electrodes to which a transverse voltage is applied; see beamlet b2 of FIG. 4) in a way that it will be absorbed or otherwise removed out of the beam path before it can reach the target; thus, the aperture is effectively non-transparent or opaque to the beam.

The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands or even in the order of millions; of the beamlets shown, the second from the left is depicted switched off as it is deflected within the PD device 102 and absorbed on a stopping plate 17, which is situated at or near the second cross-over c2 of the charged particle projection optics; the other beamlets, which are switched-on, pass through a central opening of the plate 17 and thus are projected onto the target The pattern as represented by the patterned beam pb is projected by means of a charged-particle optical projection system 103 towards the substrate 14 (such as a 6" mask blank with resist coating); since the beamlets which are switched off are absorbed at the stopping plate 17, only the switched-on beamlets will form an image of the switched-on apertures. The projection system 103 implements a demagnification of, for instance, 200:1, as realized by the applicant. The substrate 14 may be, for instance, in the case of an eMET-type system a 6-inch mask blank or a nanoimprint 1× mask or master template, covered with an resist layer, whereas for a PML2 system the substrate 14 may be a silicon wafer covered with a particle sensitive resist layer. The substrate 14 is held and positioned by a substrate stage (not shown) of the target station 104.

The projection system 103 is, for instance, composed of two consecutive charged-particle optical projector sections with a crossover c1 and c2, respectively. The particle-optical lenses 30, 31 (comprising, for instance, an electrostatic multi-electrode accelerating lens 30 and two magnetic lenses 31) used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector section images the plane of the apertures of the PD device to an intermediate image which in turn is imaged onto the substrate surface by means of the second projector section. Both sections employ a demagnifying imaging through crossovers c1,c2; thus, while the intermediate image is inverted, the final image produced on the substrate is upright (non-inverted). The demagnification factor is about 14:1 for both stages, resulting in an overall demagnification of 200:1. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the charged-particle optical system can be found in the above-cited prior art.

As a means to introduce a small lateral shift to the image, i.e. along a direction perpendicular to the optical axis cx, deflection means 16 are provided in one or both of the projector sections. Such deflection means can be realized as, for instance, a multipole electrode system, as discussed in U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By virtue of the pattern formed in the PD device 102, an arbitrary beam pattern can be generated and transferred to a substrate.

PD System and Plate Architecture

Figure 2:
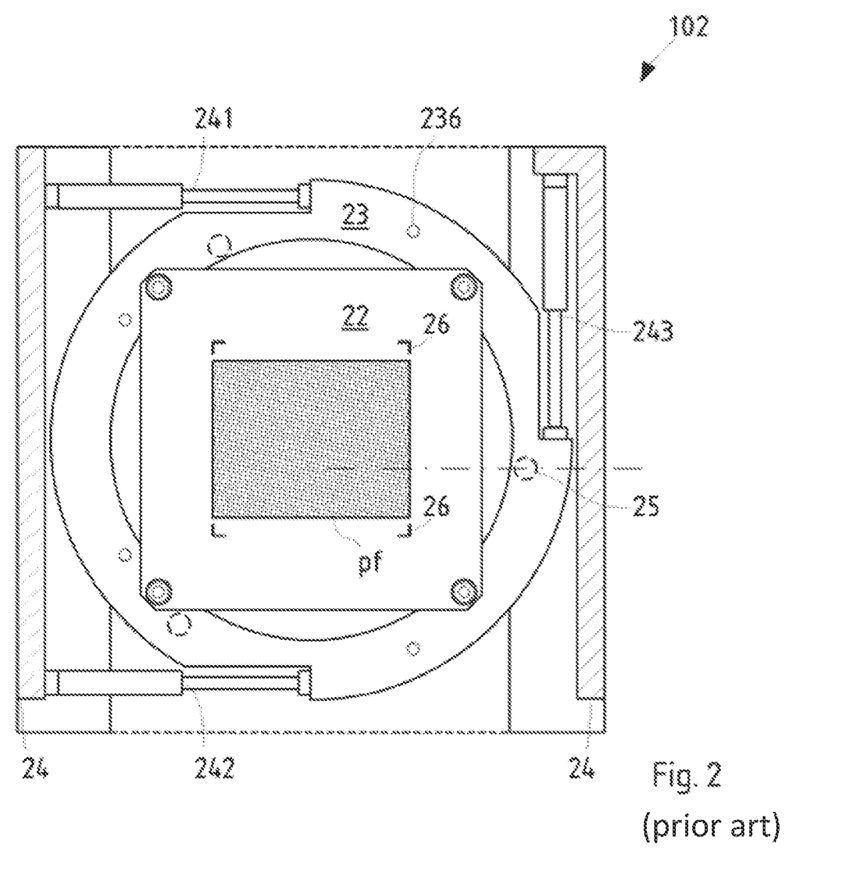
FIG. 2 a top view of a PD system.
Figure 3:
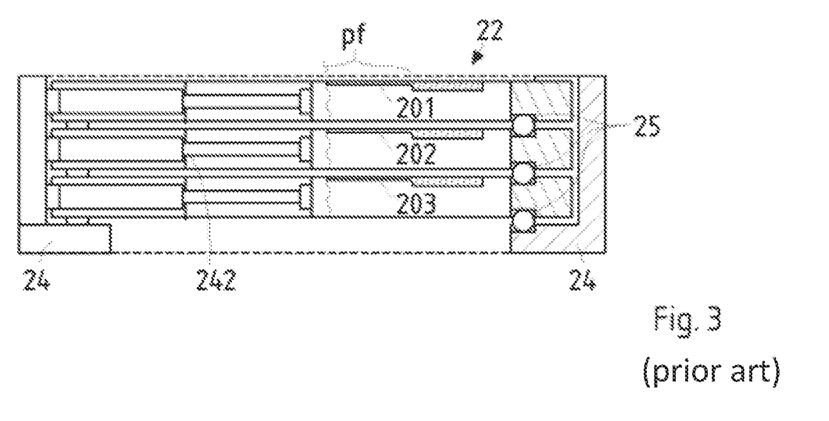
FIG. 3 a side view in a partial section (right half of the drawing) of the PD system of FIG. 2.

FIG. 2 and FIG. 3 show one embodiment of the PD system 102 of the apparatus 100, namely, in FIG. 2 a top view and in FIG. 3 a combined side and longitudinal-sectional view. FIG. 4 shows a detail of the sectional view in FIG. 3, a section of the plates of the PD system 102 along the paths of five beamlets traversing the PD system 102 (five other prospective beamlets are eliminated within).

The PD system 102 comprises a number of plates 22 mounted in a stacked configuration, realizing a composite device whose components serve respective functions, including for an aperture plate 201, a beam selection plate 202 and a blanking plate 203. Further component plates may also be present, such as an adjustment plate for individual fine adjustment of the beamlet paths (not shown here, cf. U.S. Pat. No. 6,768,125). Each of the plates 22 is realized as a semiconductor (in particular silicon) wafer in which the structures were formed by microstructuring techniques known in the art, in particular a membrane portion formed in the middle of the plate, representing a PD field pf having a plurality of openings, symbolized by a cross-hatching in FIG. 2. The lithography beam traverses the plates through the consecutive openings in the PD field pf as further explained below.

The plates 22 are held by chucks 23 which are positioned with respect to each other by means of actuator devices 241, 242, 243 which are realized as piezoactuators or nanopositioning elements of known type, attached to the chucks through flexure joints and fixed at a support structure 24 of the PD system. In the vertical direction the chucks are connected using slideable bearings 25. Preferably, the plates 22 and chucks 23 are produced from the same material, e.g. silicon, or materials having the same thermal expansion behavior in the operating temperature range. The chucks also provide for the electric supply of the blanking plate 203; for the sake of clarity, the electric lines are not shown in the figures.

In the plates 22 reference marks 26 may be provided for the definition of reference beams. The shape of the reference beams rb is defined, for instance, in an opening formed in one of the plates 22, for instance the aperture plate 201, whereas the corresponding openings in the other plates are wide enough so as to let pass the radiation for the reference beams. The reference beams are then imaged together with the patterned beam pb; in contrast to the patterned beam, however, the reference beams do not reach the substrate 41 but are measured in an alignment system (cf. U.S. Pat. No. 7,772,574). Furthermore, the chucks 23 may have alignment openings 236 which serve as alignment markers for relative positioning of the chucks 23 and the plates 22 they hold.

The thickness of the membrane portion in each of the plates 22 is about 30 to 100 μm; the membrane of the blanking plate may be thicker if this is suitable in view of better thermal conductivity. The frame portion of the plates is well thicker, in the order of 0.750 mm. The mutual distance of the plates is in the order of 0.5 to a few mm. It should be noted that in FIG. 4 the dimensions in the longitudinal axis (z-axis parallel to the optical axis of the apparatus) are not to scale.

Figure 4:
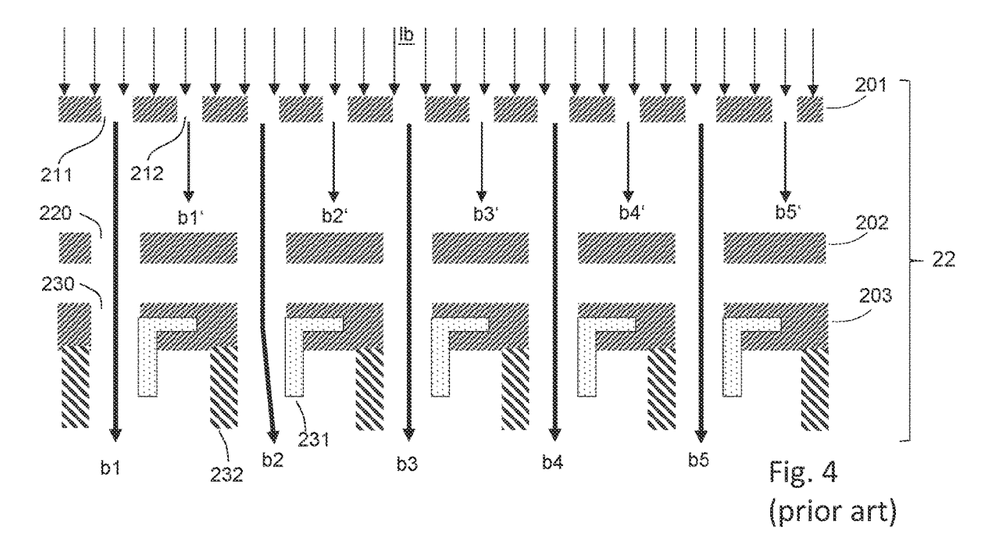
FIG. 4 a sectional detail of a PD setup having a three-plate configuration, in which an AAD realized as an aperture plate comprises two sets of apertures; the first set of apertures is activated, while the second set is stopped at the opening array device.

FIG. 4 shows a longitudinal section detail of the membrane portions of the plates 22 of FIG. 3; only the portion corresponding to the path of ten prospective beamlets (from which, five are selected as final beamlets) out of a large number of beamlets in the PD field pf are shown. As already mentioned, the embodiment shown realizes a three-plate arrangement composed of three plates 201, 202, 203, of which the first plate 201 realizes an AAD (aperture plate), the second plate 202 realizes an opening array device (beam selection plate), while the third plate 203 serves as a deflection array device (blanking plate). The first plate is an aperture array device realized as an aperture plate 201 having multiple sets of apertures 211, 212 of different size and/or shape as further explained below. The apertures 211 define prospective beamlets b1 . . . b5, while the apertures 212 define prospective beamlets b1' . . . b5'; all prospective beamlets thus formed travel towards the beam selection plate 202. The beam selection plate is equipped with apertures 220 such that only one set of prospective beamlets can move further, here apertures 211 and beamlets b1 . . . b5, while the other prospective beamlets (here b1' . . . b5') are eliminated by essentially being absorbed at the beam selection plate. To this end the openings 220 in the beam selection plate have a width which is larger than the apertures 211, 212.

Figure 5:
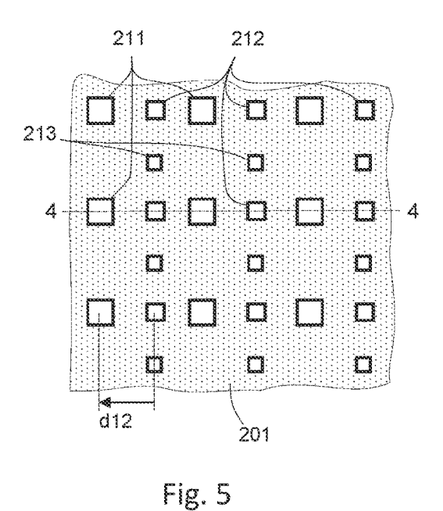
FIG. 5 a top view of a portion of the aperture plate of a PD system of the invention.

FIG. 5 shows a top view of a portion of the aperture plate 201, where the portion shown comprises only 3×3 groups of apertures, each group comprising three different types 211, 212, 213 of apertures. The line 4-4 depicts the line of section for the sectional view of FIG. 4. The arrow d12 indicates the relative offset between an aperture 211 of one type and an aperture 212 of another type, by which offset the aperture plate is shifted for selecting the apertures 212 rather than the apertures 211.

The third plate 203 of the PD system 200 is a deflection array plate, usually called blanking plate. It has a set of openings 230 whose positions correspond to the path of beamlets b1 . . . b5 as determined by the aperture plate 201; but the openings 230 have widths that are greater than those of the apertures 211, 212 (in other words, the openings 230 are larger) so the beamlets pass through the former without affecting the blanking plate material. Each of the openings 230 is provided with electrodes 231, 232 so as to be able impart a small but sufficient deflection to the corresponding beamlet, depending on an electric voltage selectively applied between each pair of electrodes 231, 232; for instance, one electrode 232 is held at a ground potential and serves as counter electrode, while the other electrode 231 serves as active electrode which is connected with a circuit layer of the blanking plate 203 for applying a electric potential for deflecting the selected beamlet(s) b1 . . . b5. Each beamlet can thus be deflected individually. The blanking plate also comprises the circuitry for electronic controlling and electric supply of the electrodes. Further details of a PD device, including details of the circuitry of a blanking plate, are discussed in U.S. Pat. Nos. 6,768,125, 7,781,748, as well as 8,222,621 B2 of the assignee/applicant.

Each of the beamlets b1 . . . b5 thus selected traverses the subsequent openings of the plates 22 along its nominal path provided the corresponding blanking electrodes 231, 232 are not energized; this corresponds to the "switched-on" state of the aperture. A "switched-off" aperture is realized by energizing the electrodes, namely, applying a transverse voltage. In this state, as shown with beamlet b2, the corresponding blanking electrodes 231, 232 deflect the beamlet b2 off its nominal path so the beamlet is deflected to a (slightly but sufficiently) different path which eventually leads to some absorbing surface, preferably on a blocking aperture 17 located around of one of the crossovers c1, c2 (FIG. 1). In the exemplary depiction of FIG. 4 the angle of deflection of the deflected beamlet b2 is shown exaggerated for better visibility.

Aperture Plate and Multiple Aperture Grids

The apertures 211, 212, and preferably the corresponding openings 220 in the beam selection plate and corresponding openings 230 in the blanking plate as well, are arranged in a systematic manner along defined grids. Each grid is, for instance, a regular rectangular array, or a regular array forming staggered lines running parallel to a direction which corresponds to the relative movement of the images of the apertures over the target as described in U.S. Pat. No. 6,768,125. In each line of the arrangement the offset between consecutive apertures of same type is preferably a multiple of a grid width underlying the aperture arrangement, as illustrated in FIG. 5 for one embodiment of the invention. The openings shown in FIG. 5 shows three interlaced grids which each represent such an arrangement. Generally, the apertures will be located on the points of a substantially regular two-dimensional lattice, but the lattice may additionally have small deviations from an exact regular lattice in order to account for possible distortions in the imaging system, so as to compensate such imaging errors by small deviations in the positions of the apertures and achieve an exact, compensated position of the respective aperture images on the target.

As described above, the aperture plate comprises multiple sets of apertures, wherein each set of apertures can be selected to be imaged onto the target. Further details of a PD device, concerning selection of a certain set of apertures and mutual alignment of aperture plate, beam selection plate and blanking plate are discussed in U.S. Pat. No. 6,768,125.

Figure 6:
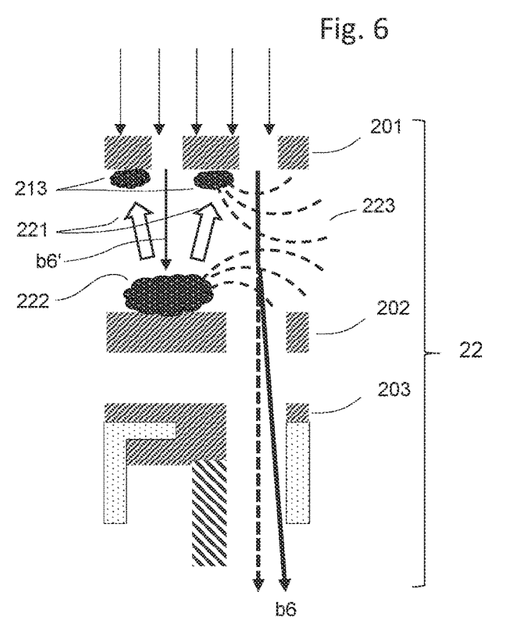
FIG. 6 a detail of FIG. 4 which also illustrates the potential generation of electrically charged secondary particles and subsequent electrical charge accumulation at various sites of the aperture array device and opening array device.

FIG. 6 depicts the problems in the use of the PD device as observed by the inventors and already described above (section "prior art"). FIG. 6 is an enlarged partial view of FIG. 4. The beamlet b6' (which can be any one of beamlets b1' . . . b5' of FIG. 4), will interact with the bulk material of the beam selection plate 202 and generate secondary particles 221, for example electrons. While some part of the secondary particles will remain within the material, the other part will be emitted from the material. Predominantly in direct line of sight, the secondary particles (especially electrons) may deposit and cause an accumulation of electric charge at nearby sites of the beam selection plate and aperture plate, denoted by reference numbers 222 and 213 in FIG. 6. Where such electric charge is accumulated, it will form an electric field, symbolized by the dashed electric force lines 223 in FIG. 6, which may have the effect of deflecting the beamlet b6 (which can be any one of beamlets b1 . . . b5 of FIG. 4), thus causing unwanted beamlet displacement at the target surface and therefore degrade pattern fidelity.

Beam Selection Plate with Absorber Structures

Figure 7:
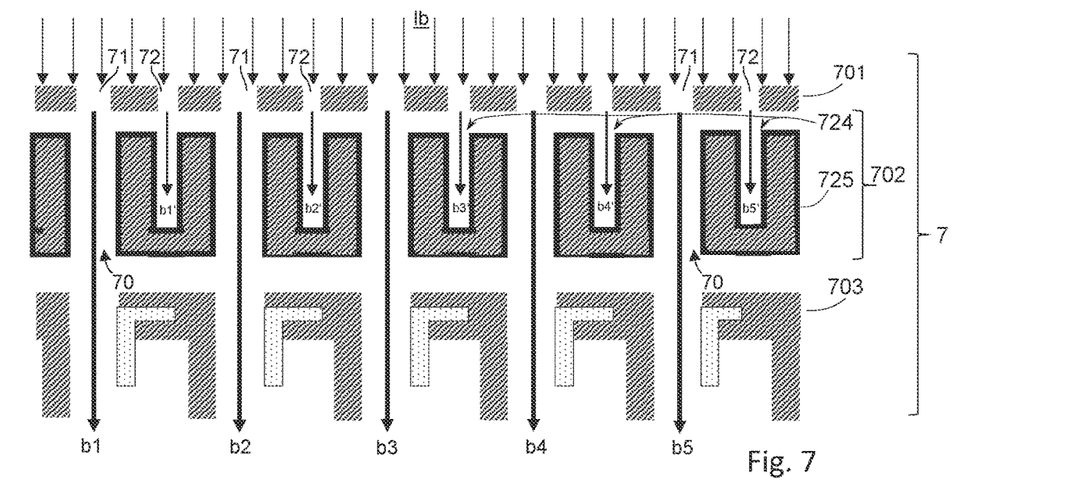
FIG. 7 an embodiment of the invention having an absorber array device having blind holes fabricated into its upstream surface and a thin conductive coating (shown is only a portion of the PD system)
Figure 8:
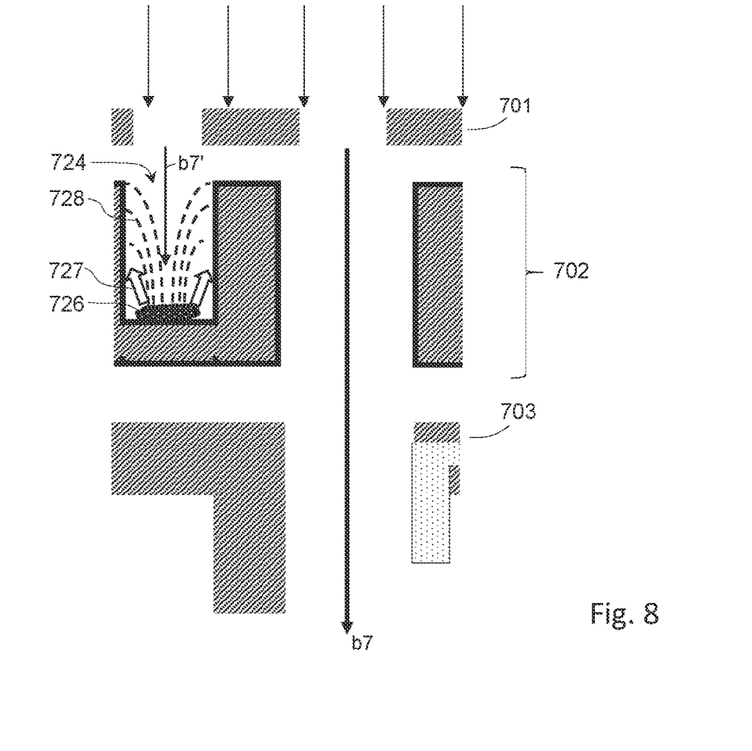
FIG. 8 a detail of FIG. 7, illustrating the improved behavior of beamlet propagation thanks to the absorber array device.
Figure 9:
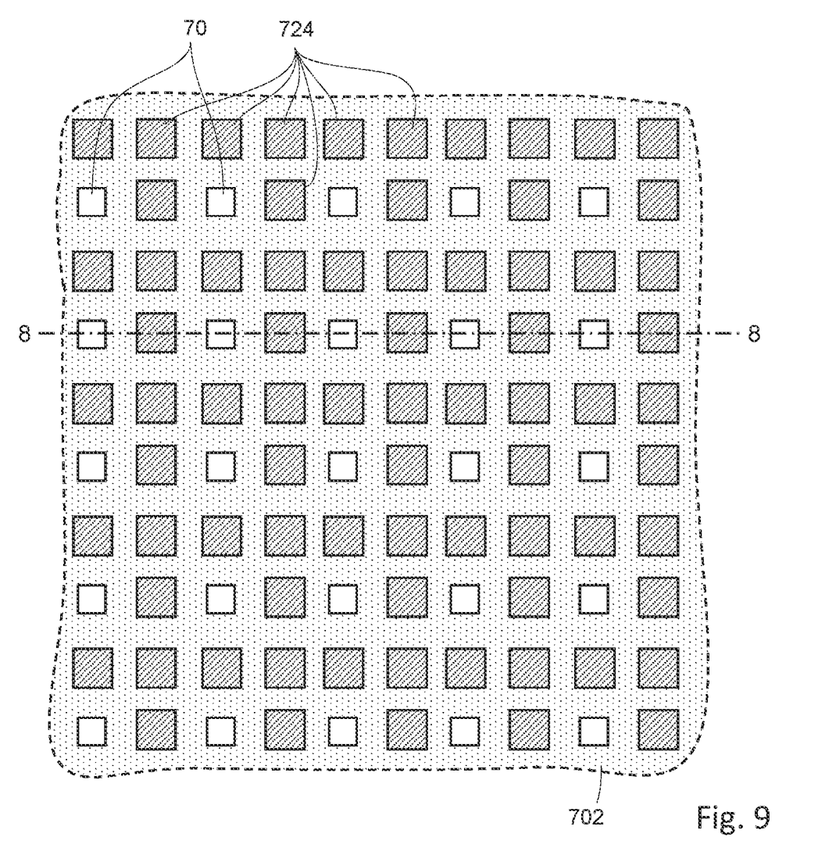
FIG. 9 a top view of the absorber array device of FIG. 7 (shown is only a portion corresponding to FIG. 7)

FIGS. 7 to 9 illustrate one embodiment of a PD device including an absorber array device according to the invention. In this embodiment, a PD device 7 comprises an aperture plate 701, a beamlet selection plate 702, and a blanking plate 703. (The aperture plate 701 and the blanking plate 703 can be realized with identical layout as the respective components 201, 203 described above.) More specifically, FIG. 7 shows a longitudinal section analogous to FIG. 4, FIG. 8 shows a detail of FIG. 7 for one group of prospective and selected beamlets, and FIG. 9 shows a top view of the beamlet selection plate 702; the line 8-8 indicates the line of section for the sectional view shown in FIG. 7. The beamlet selection plate 702 realizes an absorber array device according to the invention; it comprises a number of openings 70 which correspond to one of the sets of apertures 71 in the aperture plate 701. Furthermore, the beamlet selection plate 702 is provided with a charged-particle absorbing structure 724, which is configured to absorb the prospective beamlets b1' . . . b5' of the other set(s) of apertures 72 before they can impinge on the blanking plate 703. The structure 724 is preferably realized within the bulk material of the beamlet selection plate 702.

Generally, the charged-particle absorbing structure comprises a number of absorbing regions which are surrounded by elevated regions forming walls facing the absorbing regions, which are referred to as absorber flanks; these walls are formed vertical or nearly vertical with an inclination close to 90°, as can be achieved by known processing methods. In many embodiments, as illustrated in FIGS. 7 and 8, for instance, the structure 724 can be realized as a plurality of absorbing devices which are formed as blind holes or trenches. Such blind holes and/or trenches can be produced, for example, by utilizing a reactive etching process of known type. Here, the term "blind hole" denotes a recess-like structure which has limited dimensions in the X-Y-directions, which corresponds to the region of one beamlet impinging. The term "trench" means a wider structure which encompasses the impinging region of more than one beamlet, such as two, three, four beamlets, up to a considerable number of beamlets or even an entire row of beamlets. The realization of the charged-particle absorbing structure as a plurality of blind holes (or recesses) is preferred since this will ensure that the electric charge deposited by the beamlet as well as any secondary particles are enclosed and confined on all sides.

The blind holes or trenches may, favorably, be realized so as to have a lateral width larger than the sizes of the beamlet defining apertures formed within the aperture plate 701 (see apertures 211, 212 of FIG. 5) plus a margin which may be determined so as to encompass possible tolerances and deviations, allowing the entire amount of the beamlets b1' . . . b5' to be absorbed in the structure 724. The additional margin of the lateral width of the blind hole will also serve to tolerate a certain amount of lateral misalignment between the aperture plate 701 and the beam selection plate 702. Simulations calculated by the applicant showed that, advantageously, the blind holes or trenches may be realized so as to have a depth to width ratio larger than 2, although other aspect ratios of 1.5 or more, or 3 or more are expected to be beneficial as well. This will, referring to FIG. 8, ensure that radiation-effected accumulation of electrically charged contaminations 726 and secondary particles 727, which may be generated by a beamlet b7', are located at the bottom faces of the structure 724, which serve as absorbing regions so as to confine the secondary particles 727 and any related electric fields 728 within the structure 724 entirely or at least to a large extent.

As mentioned above, the angular distribution of secondary particles may be described essentially by a cosine law. In the case of secondary particle generation at the bottom of the blind holes, this will cause hitting the sidewalls of the blind holes by a certain amount of secondary particles. The other fraction of secondary particles will still escape by the top opening of the blind hole. For a blind hole depth to width ratio close to 2, more than 50% of the secondary particle will be confined within the blind hole. Higher aspect ratios will raise the fraction of confined secondary particles accordingly. Therefore, potential charge accumulation at other sites (such as site 213 of FIG. 6), as well as a deflection of beamlet b7 due to electric fields 728 resulting from contaminations 726, caused by the absorbed beamlet b7', will be reduced effectively.

Furthermore, it may be advantageous to have a thin electric conductive coating 725 applied to the surface of the plate 702, which coating may be present on both sides or at least the upstream side of the plate. This will enhance dissipation of accumulated charge and further reduce residual electric fields. Such a conductive coating can be realized, for instance, by sputter coating the beam selection plate with several nm, for example 10 nm, of intrinsically highly conductive metal as Au or Pt.

In addition the PD device 7 of FIG. 7 may be provided with a positioning arrangement (not shown in FIG. 7), comprising positioning devices like those shown in FIGS. 2 and 3. The positioning arrangement serves to adjust the relative position in the X-Y-plane between the aperture plate 701 on one hand and the beamlet selection plate 702 (and blanking plate 703) on the other hand. In some embodiments, the relative position may be adjusted by external devices or by hand, and in this case the positioning arrangement may be dispensed with as component of the PD device according to the invention.

The distance between the aperture plate 701 and beamlet selection plate 702 is chosen suitably so as to allow free relative movement between the plates. A typical value of the distance (i.e. the free space between the respective plates taken along the Z direction) is in the order of 0.5 mm to a maximum value of about 20 mm or preferably about 5 mm, and more preferably the distance may be 1-2 mm.

Figure 10:
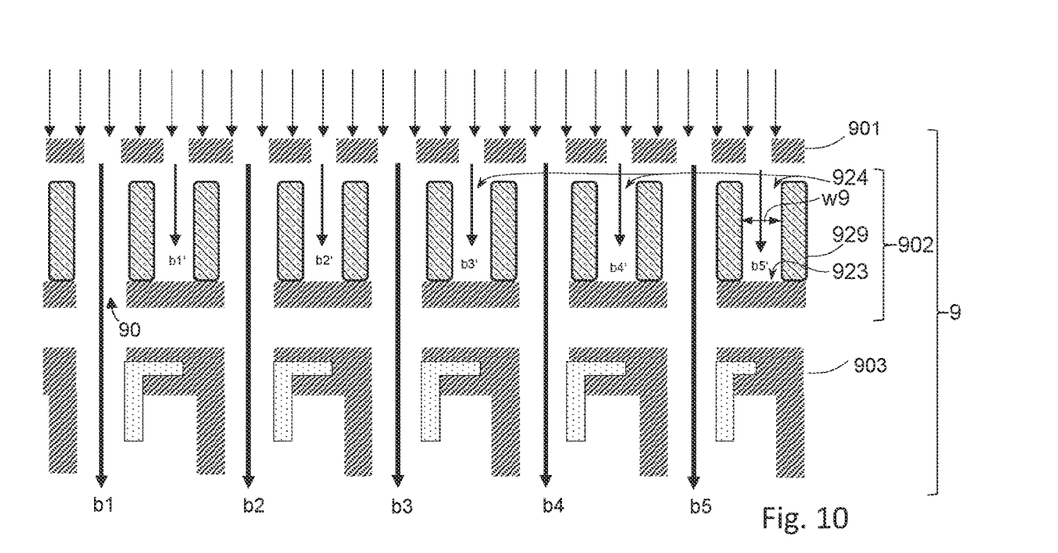
FIG. 10 another embodiment of the invention having screening electrodes formed on the upstream surface of the opening array device (shown is only a portion of the PD system)
Figure 11:
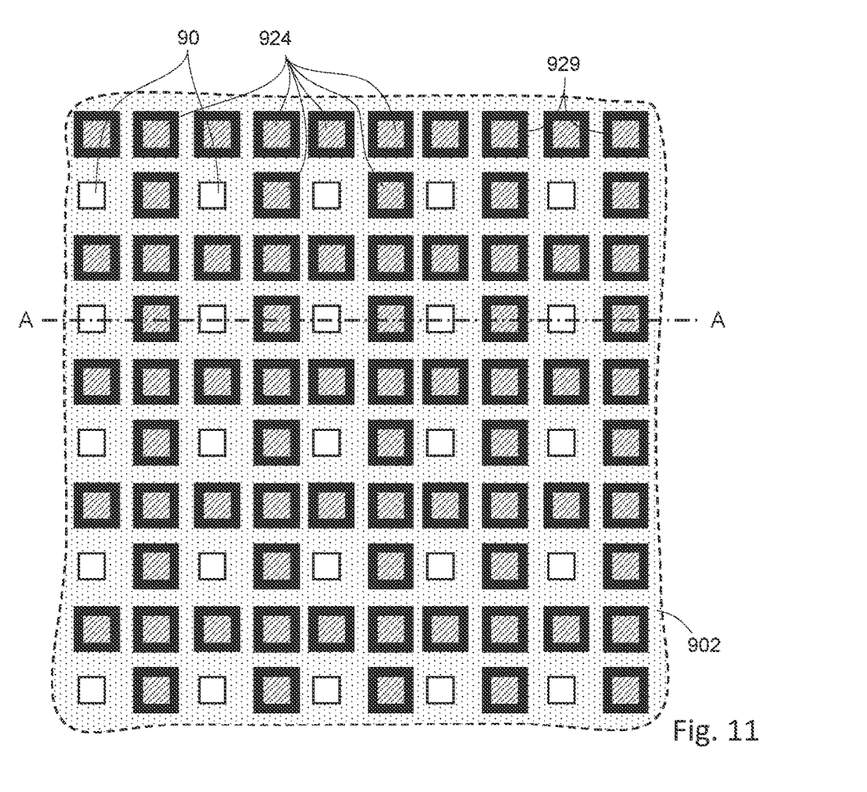
FIG. 11 a top view of the absorber array device of FIG. 10 (shown is only a portion that corresponds to FIG. 10).

According to another embodiment of the invention shown in FIGS. 10 and 11, a PD device 9 may include a beamlet selection plate 902 in which the charge-particle absorbing structure 929 is realized as a plurality of protruding features formed on the bulk material of the beamlet selection plate 902. (The aperture plate 901 and the blanking plate 903 of this embodiment can be identical to the corresponding components 701, 703 of the embodiment of FIG. 7 and corresponding components 201, 203 respectively.) For instance, the absorbing structure 924 may be realized as free standing prismatic objects 929, referred to as "shielding electrodes" or "screening electrodes" hereinafter, for example made from metallic conductive material or at least coated with a thin conductive layer at the surface. The screening electrodes may be arranged in a manner so as to form an arrangement which essentially corresponds to an "absorber tube" with rectangular cross section shape. A galvanic deposition process as well known in the art may be used to fabricate the screening electrodes on the surface of the beam selection plate. FIG. 10 shows a longitudinal section analogous to FIGS. 4 and 7, and FIG. 11 shows a top view of the beamlet selection plate 702; the line A-A indicates the line of section for the sectional view shown in FIG. 10.

The mutually facing walls of the screening electrodes 929 realize absorber flanks surrounding the areas of absorbing regions 923 in this embodiment. The mutual lateral distance w9 of opposing walls of these screening electrodes as measured across the location of the beamlets to be absorbed may, favorably, be larger than the sizes of the beamlet defining apertures formed within the aperture plate 901 (see apertures 211, 212 of FIG. 5), plus possibly a margin which may be determined so as to encompass possible tolerances and deviations, allowing the entire amount of the non-selected beamlets b1' . . . b5' to be consumed in the surface portions between the screening electrodes, which thus serve as absorbing regions. A somewhat larger lateral distance w9 between the screening electrodes can additionally account for a certain amount of lateral misalignment between the aperture plate 901 and the beam selection plate 902. (The blanking plate 903 is equivalent to the blanking plate 703 of the previous embodiment.) As with the structure 724, the space enclosed by the screening electrodes 929 ("absorber tube") may advantageously be realized with a depth to inner width ratio larger than 2, although other aspect ratios as mentioned above may be beneficial as well. Considerations regarding the efficiency of confining secondary particles as well as screening electric fields generated by accumulated electric charge are identical to those discussed in the preceding embodiment of the invention.

In a variant embodiment, the absorber structure 924 may be realized as a plurality of tubes of prismatic or cylindrical shape, for example made from metallic conductive material or at least coated with a thin conductive layer at the surface. A galvanic deposition process as known in the art may be used to fabricate the cylindrical/prismatic tubes on the surface of the beam selection plate. As with the structure 724, the cylindrical/prismatic tubes may favorably be realized having a depth to inner width ratio larger than 2, although other aspect ratios as mentioned above may be beneficial as well. Considerations regarding the efficiency of confining secondary particles as well as screening electric fields generated by accumulated electric charge are identical to those discussed in the preceding embodiments of the invention.

The inner diameter w9 of the tubes (i.e., "tubes" formed by screening electrodes or prismatic/cylindrical tubes) may, favorably, be equal to or somewhat larger than the sizes of the beamlet defining apertures formed within the aperture plate 901 (see apertures 211, 212 of FIG. 5), plus possibly a margin which may be determined so as to encompass possible tolerances and deviations. By this the entire amount of the beamlets b1' . . . b5' will be consumed within the tube, the bottom faces of the structure which will serve as absorbing regions 923. A somewhat larger inner diameter w9 of the tubes may ensure to account for a certain amount of lateral misalignment between the aperture plate 901 and the beam selection plate 902.

What is claimed is:

1. A multi-beam pattern definition device for use in a particle-beam processing or inspection apparatus, said device being adapted to be irradiated with a beam of electrically charged particles and allow passage of the beam through a plurality of apertures thus forming a corresponding number of beamlets, said device comprising:
    an aperture array device in which said apertures are realized, wherein the aperture array device comprises at least two sets of apertures, each set of apertures comprising a plurality of apertures transparent to said beam, the apertures of each set being arranged in a substantially regular aperture arrangement on the aperture array device with the aperture arrangements of said sets being interlacing at least partially, wherein the aperture arrangements, at least in a region where the aperture arrangements are interlacing, realize mutually equivalent arrangements offset to each other by respective displacement vectors but otherwise having equivalent relative locations of apertures,     an absorber array device located downstream of the aperture array device, said absorber array device including:

a plurality of openings configured for the passage of beamlets that are formed by a subset of said apertures of the aperture array device,         said plurality of openings in the absorber array device being arranged in a substantially regular arrangement corresponding to the aperture arrangement of a first set of said sets of apertures of the aperture array device in at least a region corresponding to said region where the aperture arrangements are interlacing,         a charged-particle absorbing structure comprising absorbing regions surrounded by absorber flanks elevated with respect to said absorbing regions and configured to absorb charged particles impinging thereupon,         said absorbing regions being located at locations corresponding to the locations of apertures in the aperture arrangements of said sets of apertures of the aperture array device other than said first set of apertures, in at least a region corresponding to said region where the aperture arrangements are interlacing.

2. The multi-beam pattern definition device of claim 1, further comprising a deflection array device having a plurality of blanking openings located such that each of the beamlets traverses one of the blanking openings along a nominal path, the deflection array device comprising a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

3. The multi-beam pattern definition device of claim 1, wherein the charged-particle absorbing structure comprises a plurality of charged-particle absorbing devices, each of which is located at a position on the absorber array device corresponding to a place where one of the beamlets impinges and is configured to absorb charged particles of said beamlet.

4. The multi-beam pattern definition device of claim 1, wherein the charged-particle absorbing structure comprises a plurality of charged-particle absorbing devices realized as recesses or blind holes formed in a surface of the absorber array device.

5. The multi-beam pattern definition device of claim 4, wherein the recesses or blind holes have a depth to width ratio larger than 2.

6. The multi-beam pattern definition device of claim 4, wherein the recesses extend along respective directions of impingement of the beamlets upon a surface of the absorber array device.

7. The multi-beam pattern definition device of claim 1, wherein the charged-particle absorbing structure comprises a plurality of charged-particle absorbing devices realized as electrode-like structures protruding from a surface of the absorber array device.

8. The multi-beam pattern definition device of claim 7, wherein the electrode-like structures have a depth to width ratio larger than 2.

9. The multi-beam pattern definition device of claim 1, wherein the charged-particle absorbing structure comprises trenches or openings having a width which is larger than a lateral size of the apertures of the aperture array device by a factor of two.

10. The multi-beam pattern definition device of claim 1, wherein the absorber array device further comprises a side facing towards the aperture array device, said side comprising an electrically conductive coating formed thereon.

11. The multi-beam pattern definition device of claim 1, wherein at least one of the aperture array device and the absorber array device is movable within a plane transversal to a direction of propagation of said beam for adjusting a relative position of the aperture array device with respect to the absorber array device and selectively bring any selected set of the sets of apertures in the aperture array device into alignment with the plurality of openings in the absorber array device in at least said region of interlacing of aperture arrangements.

12. The multi-beam pattern definition device of claim 11, further comprising a positioning device for positioning at least one of the aperture array device and the absorber array device for adjusting said relative position of the aperture array device with respect to the absorber array device, said positioning device being configured to selectively bring a selected set of the sets of apertures in the aperture array device into alignment with the plurality of openings in the absorber array device in at least said region of interlacing of aperture arrangements.

13. The multi-beam pattern definition device of claim 1, wherein the absorber array device is located downstream of the aperture array device at a distance to the latter.

* * * * *